United States Patent
Liang et al.

(10) Patent No.: US 9,472,270 B2
(45) Date of Patent: Oct. 18, 2016

(54) NONVOLATILE STORAGE REFLOW DETECTION

(71) Applicant: SANDISK TECHNOLOGIES INC., Plano, CA (US)

(72) Inventors: Guirong Liang, Santa Clara, CA (US); Changyuan Chen, San Ramon, CA (US); Masaaki Higashitani, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 180 days.

(21) Appl. No.: 14/522,959

(22) Filed: Oct. 24, 2014

(65) Prior Publication Data

US 2016/0118112 A1  Apr. 28, 2016

(51) Int. Cl.
*G06F 11/00* (2006.01)
*G11C 11/56* (2006.01)
*G06F 11/07* (2006.01)
*G11C 29/42* (2006.01)
*G11C 29/44* (2006.01)
*G11C 29/52* (2006.01)

(52) U.S. Cl.
CPC ......... *G11C 11/5642* (2013.01); *G06F 11/076* (2013.01); *G06F 11/079* (2013.01); *G06F 11/0727* (2013.01); *G11C 11/5628* (2013.01); *G11C 29/42* (2013.01); *G11C 29/44* (2013.01); *G11C 29/52* (2013.01)

(58) Field of Classification Search
CPC  G11B 2220/20; G11C 29/56; G06F 11/0727
USPC .......................................................... 714/42
See application file for complete search history.

(56) References Cited

U.S. PATENT DOCUMENTS

| | | | |
|---|---|---|---|
| 5,062,567 A | 11/1991 | Nishihara | |
| 5,234,151 A * | 8/1993 | Spigarelli | B23K 3/08 228/103 |
| 6,757,861 B1 * | 6/2004 | Dong | G11B 20/1806 714/704 |
| 7,979,761 B2 * | 7/2011 | Kim | G11C 29/56 365/201 |
| 8,055,855 B2 * | 11/2011 | Sarkar | G06F 9/52 711/147 |
| 8,301,978 B2 * | 10/2012 | Seol | G06F 11/1072 365/185.09 |
| 8,484,542 B2 | 7/2013 | d'Abreu | |

(Continued)

OTHER PUBLICATIONS

Mekhanik, "Block Closure Techniques for a Data Storage Device," U.S. Appl. No. 14/286,501, filed May 23, 2014.

(Continued)

*Primary Examiner* — Amine Riad
(74) *Attorney, Agent, or Firm* — Vierra Magen Marcus LLP

(57) ABSTRACT

A non-volatile storage system includes non-volatile storage elements and one or more managing circuits in communication with the non-volatile storage elements. The non-volatile storage elements are arranged in blocks including a first block reserved for system use and a second block. The first block stores a pre-determined data pattern that was written to the first block subsequent to system testing and prior to completion of manufacturing of the non-volatile storage system. Subsequent to completion of manufacturing of the non-volatile storage system, the one or more managing circuits sense information stored in the first block and determine an error metric for the sensed information with respect to the pre-determined data pattern. The one or more managing circuits determine that the system experienced an IR reflow process if the error metric was determined to satisfy the threshold.

27 Claims, 10 Drawing Sheets

(56) References Cited

U.S. PATENT DOCUMENTS

| | | | |
|---|---|---|---|
| 8,499,192 B2* | 7/2013 | Rousseau | G06F 12/0246 711/103 |
| 8,560,901 B2* | 10/2013 | Seol | G11C 16/26 365/185.03 |
| 8,683,294 B1* | 3/2014 | Cypher | H03M 13/2909 714/763 |
| 8,806,297 B2 | 8/2014 | D'Abreu | |
| 8,910,020 B2* | 12/2014 | Frayer | G11C 11/5642 714/764 |
| 9,165,670 B2* | 10/2015 | Mekhanik | G11C 16/3427 |
| 9,229,806 B2* | 1/2016 | Mekhanik | G06F 11/1072 |
| 9,263,158 B2* | 2/2016 | Prohofsky | G06F 11/1048 |
| 2005/0157554 A1* | 7/2005 | Yanagawa | G06F 9/4401 365/185.17 |
| 2009/0070518 A1 | 3/2009 | Traister | |
| 2009/0164710 A1* | 6/2009 | Choi | G11C 16/20 711/103 |
| 2009/0300425 A1 | 12/2009 | Gollub | |
| 2010/0115325 A1 | 5/2010 | Lin | |
| 2010/0169547 A1* | 7/2010 | Ou | G06F 12/0246 711/103 |
| 2010/0332894 A1 | 12/2010 | Bowers | |
| 2011/0099460 A1 | 4/2011 | Dusija | |
| 2011/0199823 A1* | 8/2011 | Bar-or | G11C 11/5628 365/185.03 |
| 2011/0208895 A1* | 8/2011 | Wiegers | H05K 1/18 711/103 |
| 2011/0228604 A1 | 9/2011 | Eli | |
| 2012/0102012 A1 | 4/2012 | Han | |
| 2012/0226963 A1 | 9/2012 | Bivens | |
| 2012/0268945 A1* | 10/2012 | Olsson | H01L 33/58 362/311.02 |
| 2013/0003459 A1* | 1/2013 | Ulriksson | G11C 16/3418 365/185.09 |
| 2013/0097365 A1 | 4/2013 | Lee | |
| 2014/0126292 A1* | 5/2014 | Yang | G11C 7/04 365/185.18 |
| 2014/0281750 A1 | 9/2014 | Jeon | |
| 2014/0281772 A1* | 9/2014 | Jeon | G11C 16/3404 714/721 |
| 2015/0192482 A1* | 7/2015 | Araki | G01L 1/225 73/862.627 |
| 2016/0061666 A1* | 3/2016 | Ewing | G01V 8/10 250/339.05 |
| 2016/0105201 A1* | 4/2016 | Lee | H03M 13/2792 714/752 |

OTHER PUBLICATIONS

Mekhanik, "Block Closure Techniques for a Data Storage Device," U.S. Appl. No. 14/080,626, filed Nov. 14, 2013.

Mekhanik, "Data Retention Detection Techniques for a Data Storage Device," U.S. Appl. No. 14/080,655, filed Nov. 14, 2013.

Luo, "Data Storage Device Having Reflow Awareness," U.S. Appl. No. 14/505,034, filed Oct. 2, 2014.

* cited by examiner

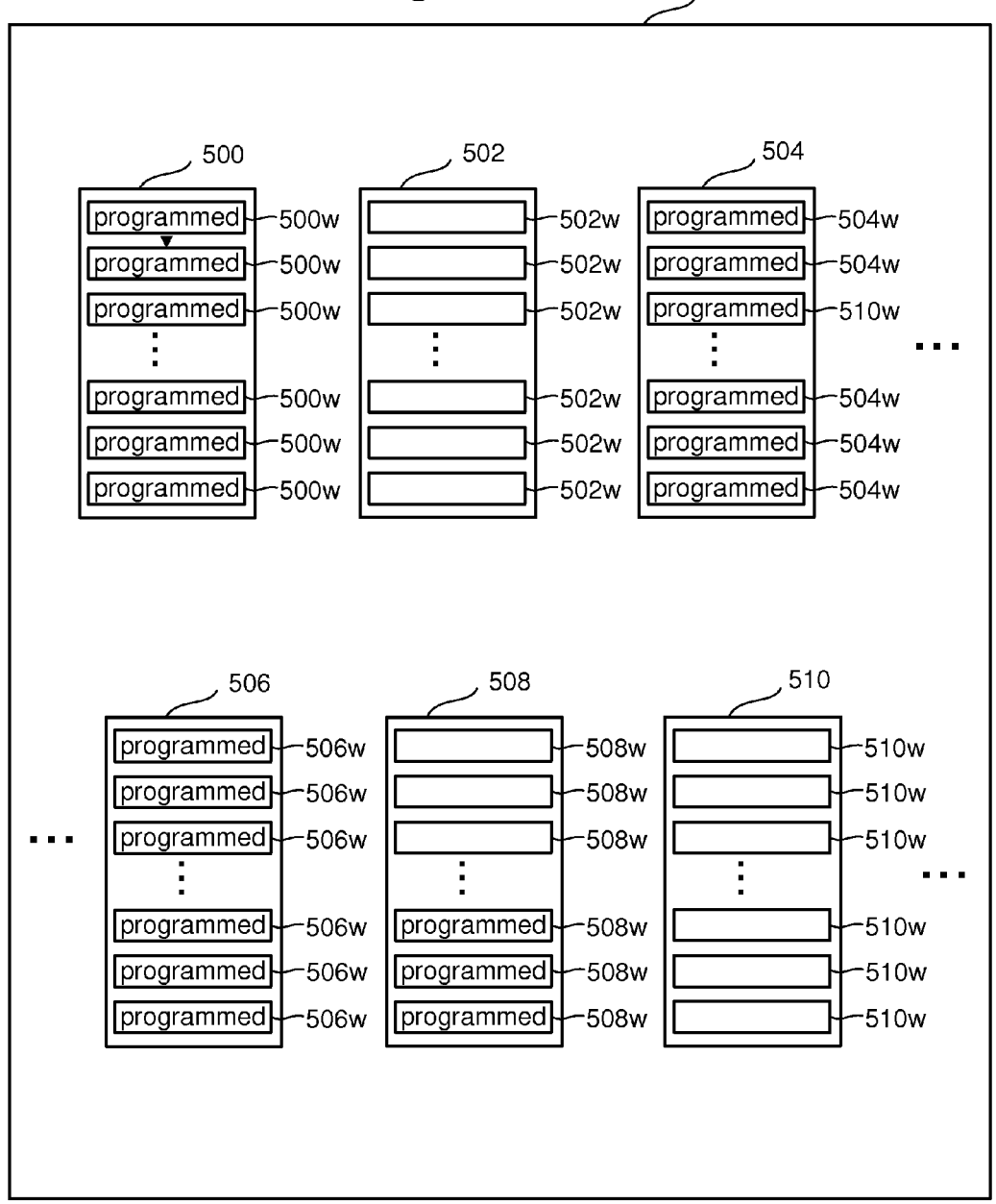

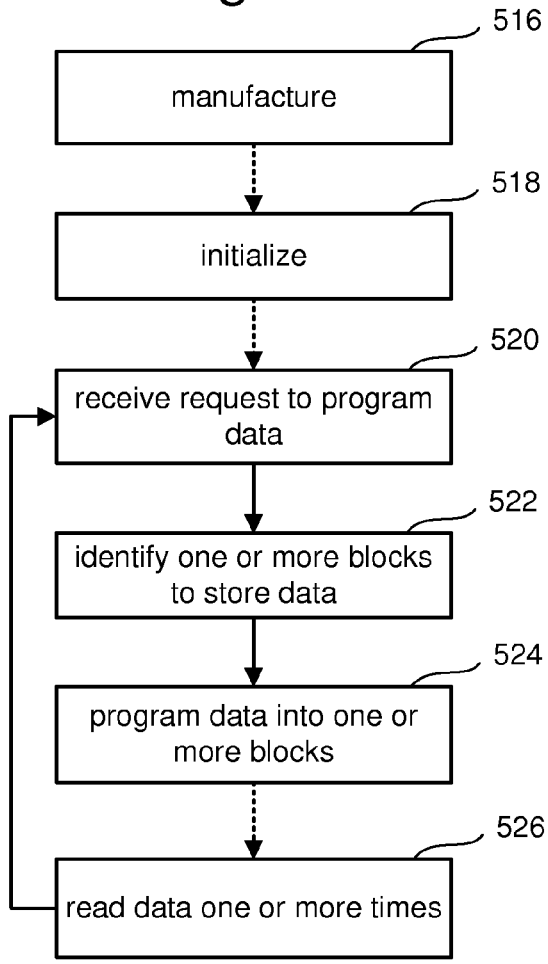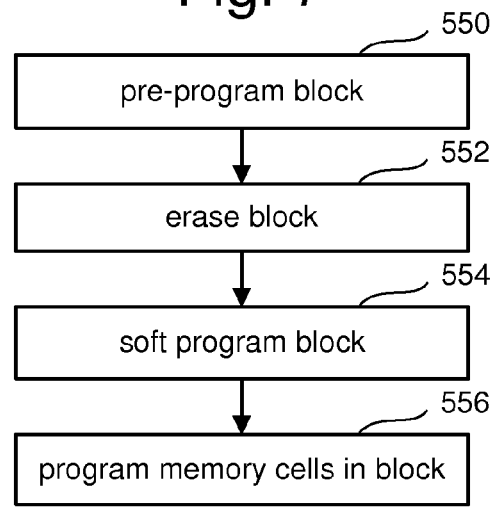

number of cells

E

Fig. 11A $V_T$ number of cells

E    IM

VvIM

Fig. 11B $V_T$ number of cells

E    IM

S0  S1  S2  S3  S4  S5  S6  S7
  Vv1' Vv2' Vv3' Vv4' Vv5' Vv6' Vv7'

Fig. 11C $V_T$ number of cells

S0    S1  S2  S3  S4  S5  S6  S7
    Vv1 Vv2 Vv3 Vv4 Vv5 Vv6 Vv7

Fig. 11D $V_T$ number of cells

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

NONVOLATILE STORAGE REFLOW DETECTION

BACKGROUND OF THE INVENTION

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state (or multi-level) flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090 both describe various data encoding schemes for multi-state flash memory cells.

A non-volatile storage device may be used as "embedded" memory of a portable computing device (e.g., mobile phone). The non-volatile storage device may be mounted to a circuit board of the portable computing device using reflow soldering (e.g., infrared (IR) reflow soldering). This reflow soldering process is a high temperature process, and can have different effects to the memory reliability depending on the state of memory cells prior to IR reflow soldering. Prior to the reflow soldering, certain data may have been stored in the data storage device using a preloading process. In some situations, one or more blocks within the data storage device may be partially written (e.g., because the total amount of data written to the data storage device is not divisible by the block size of the data storage device). The partially written block(s) may include programmed word lines as well as unprogrammed word lines. Due to effects of heating caused by the reflow process, the unprogrammed word lines may exhibit poor data retention and larger threshold voltage shifting, as compared to other word lines. Thus, certain portions of the data storage device may have lower reliability than other portions of the data storage device.

BRIEF DESCRIPTION OF THE DRAWINGS

FIG. 5A depicts an exemplary structure of a memory cell array.

FIG. 6 is a flow chart describing one embodiment of a process for making and operating a non-volatile memory system.

FIG. 7 is a flow chart describing one embodiment of a process for programming data into a block of memory cells.

FIGS. 11A-E show various threshold voltage distributions and describe a process for programming non-volatile memory.

DETAILED DESCRIPTION

Technology is proposed that provides a means for testing whether a memory has been subjected to an IR reflow process so that remedial action can be taken if an IR reflow process is detected. An example non-volatile storage system includes a plurality of non-volatile storage elements and one or more managing circuits in communication with the plurality of non-volatile storage elements. The plurality of non-volatile storage elements are arranged in blocks. A first set of one or more blocks are reserved for system use and are not available for storing user data. One or more of the blocks reserved for system use can store a pre-determined (and already known) data pattern that was written to that block(s) subsequent to (or during or before) system testing and prior to completion of manufacturing of the non-volatile storage system. Another block stores preloaded data. Subsequent to completion of manufacturing of the non-volatile storage system, and in response to an initialization event (e.g., turning on power, first use, or other event), the one or more managing circuits sense information stored in the block(s) reserved for system use that is/are storing the pre-determined data pattern and determine an error metric for the sensed information with respect to the pre-determined data pattern. That error metric is compared to a threshold. The one or more managing circuits conclude that a reflow operation was performed if the error metric satisfies the threshold. If it is concluded that a reflow operation was performed, then the one or more managing circuits are configured to operate the block storing preloaded data differently than blocks not storing preloaded data; for example, unprogrammed word lines in open blocks that contain preloaded data may be marked to prevent any future programming.

Figure 1:
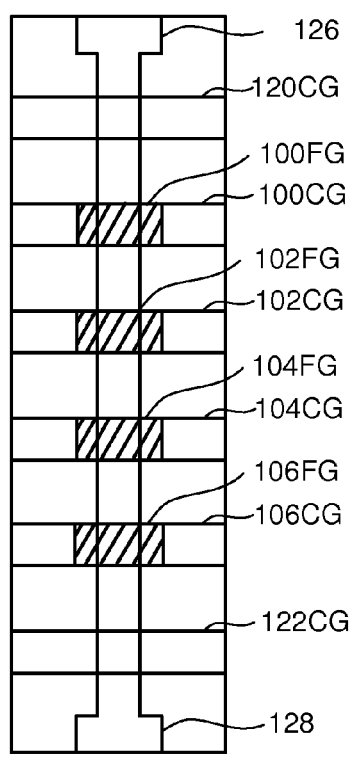
FIG. 1 is a top view of a NAND string.
Figure 2:
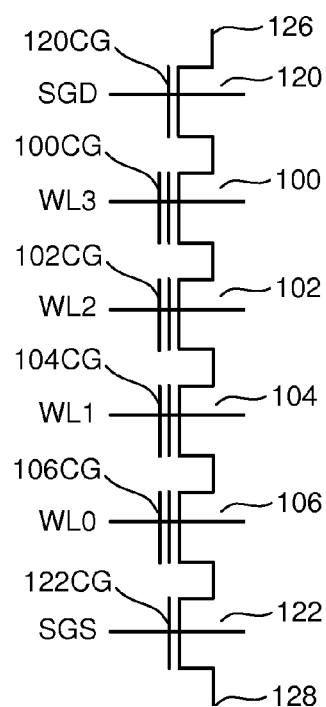
FIG. 2 is an equivalent circuit diagram of the NAND string.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will have 128 memory cells or more. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Other types of non-volatile storage devices, in addition to NAND flash memory, can also be used to implement the new technology described herein. For example, a TANOS structure (consisting of a stacked layer of TaN—$Al_2O_3$—S1N—$S1O_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

Figure 3:
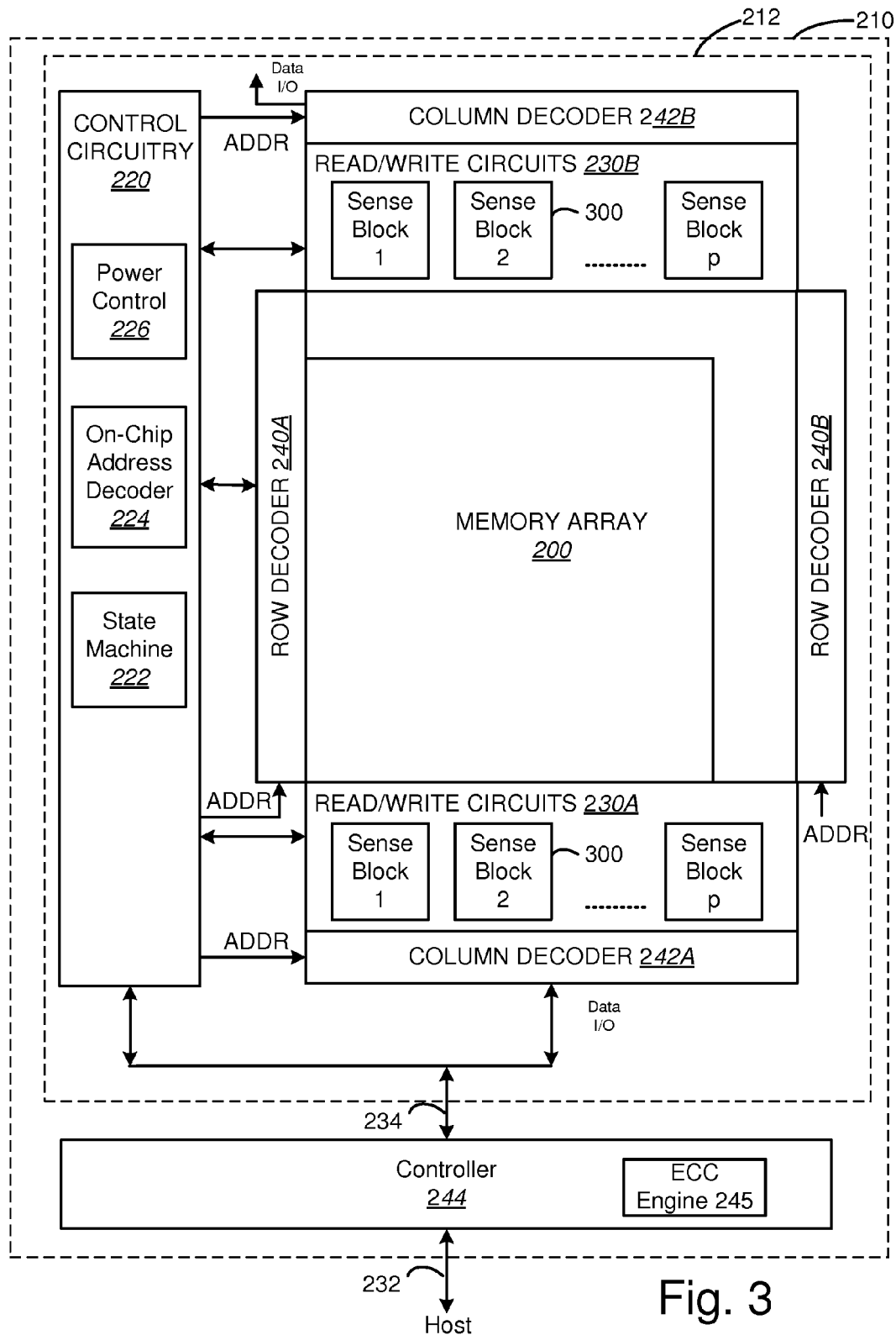
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. Some memory systems may include multiple dies 212 in communication with Controller 244.

Controller 244 includes an ECC (Error Correction Code) engine 245. In one embodiment, code words are programmed to and read from the memory array 200. ECC Engine is used to create code words for programming and decode code words form reading according to techniques known in the art.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the controller 244, collectively or separately, can be referred to as one or more managing circuits or one or more control circuits.

In one embodiment, the host is a computing device (e.g., laptop, desktop, smartphone, tablet, digital camera, etc.) that includes one or more processors, one or more processor readable storage devices (RAM, ROM, flash memory, hard disk drive, etc.) that store processor readable code (e.g., software) for programming the one or more processors to perform the methods described herein. The host may also include additional system memory, one or more input/output interfaces and/or one or more input/output devices in communication with the one or more processors.

In one embodiment, state machine 222 may be fully implemented in hardware. In another embodiment, state machine 222 may be implemented in a combination of hardware and software. For example, state machine 222 may include one or more processors and one or more processor readable storage devices (RAM, ROM, flash memory, hard disk drive, etc.) that store processor readable code (e.g., software) for programming the one or more processors to perform the methods described herein.

In one embodiment, controller 244 may be fully implemented in hardware. In another embodiment, controller 244 may be implemented in a combination of hardware and software. For example, controller 244 may include one or more processors and one or more processor readable storage devices (RAM, ROM, flash memory, hard disk drive, etc.) that store processor readable code (e.g., software) for programming the one or more processors to perform the methods described herein.

Figure 4:
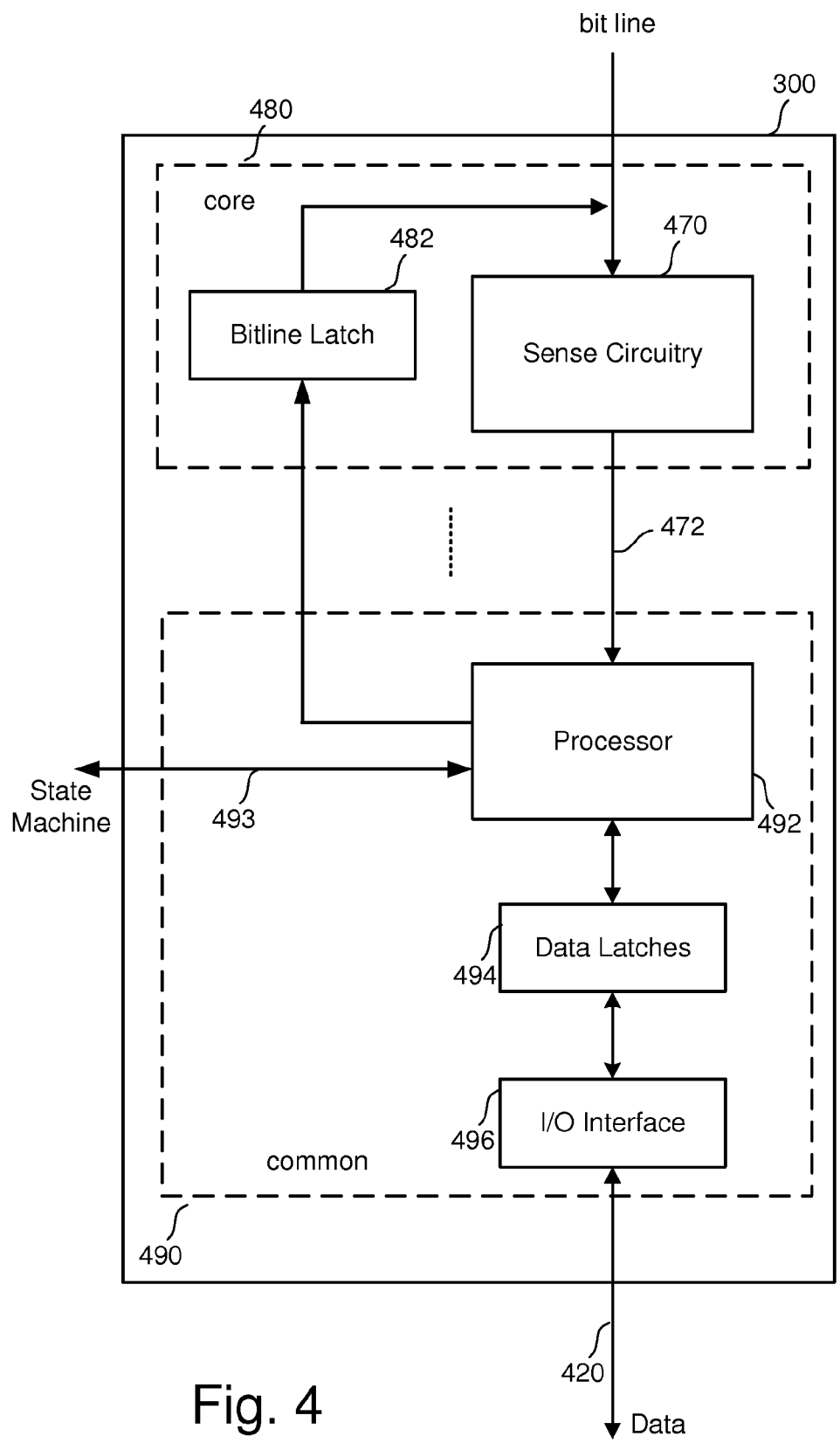
FIG. 4 is a block diagram of a non-volatile memory system.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Figure 5:
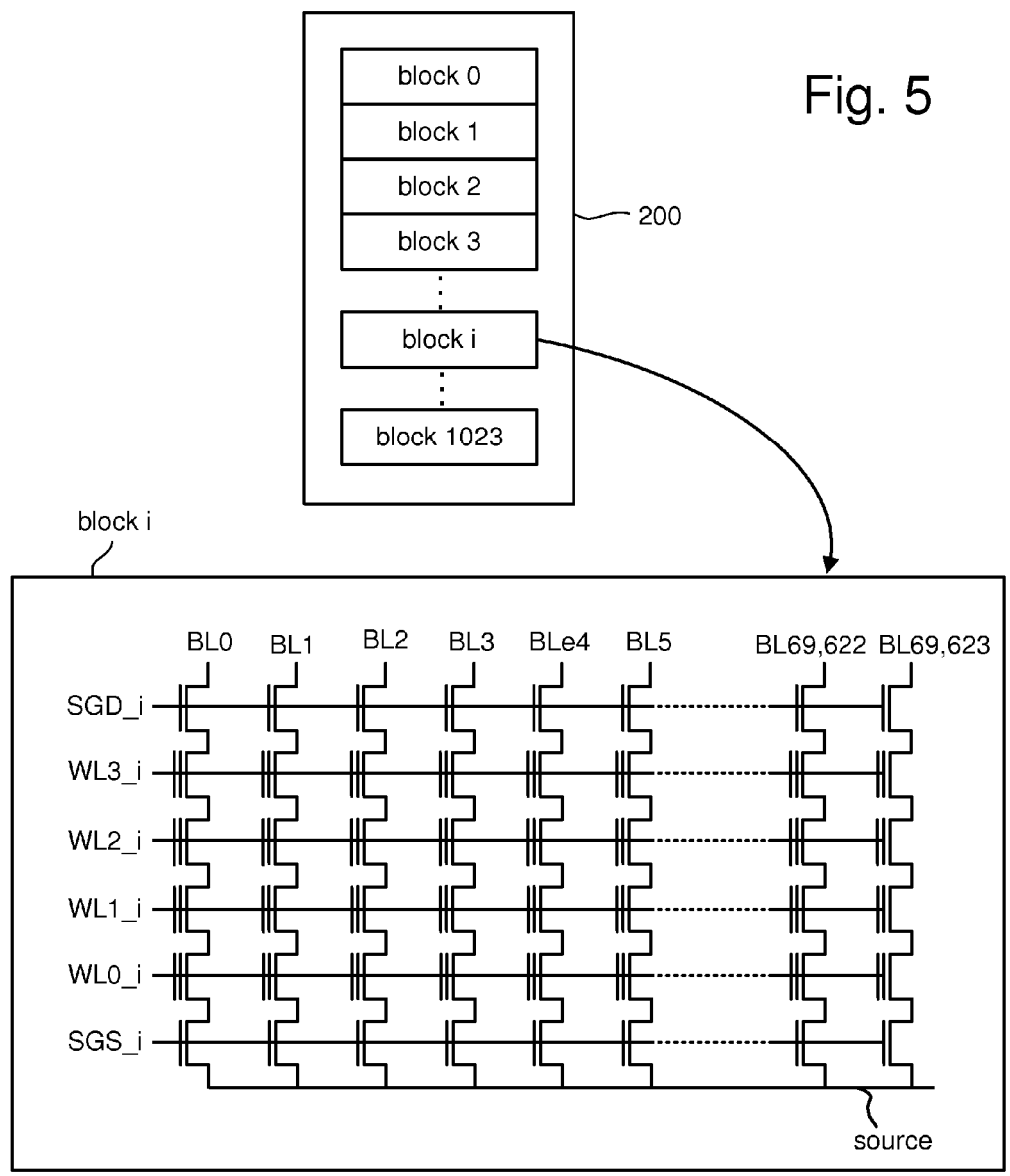
FIG. 5 depicts an exemplary structure of a memory cell array.

FIG. 5 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together. Other embodiments can use different units of erase.

As one example, the NAND flash EEPROM depicted in FIG. 5 is partitioned into 1,024 blocks. However, more or less than 1024 blocks can be used. In each block, in this example, there are 69,624 columns corresponding to bit lines BL0, BL1, . . . BL69,623. In one embodiment, all of the bit lines of a block can be simultaneously selected during read and program operations. Memory cells along a common word line and connected to any bit line can be programmed (or read) at the same time (e.g., concurrently). In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associated with other numbers of pages.

Some memory cells are slower to program or erase than others because of manufacturing variations among those memory cells, because those cells were previously erased to a lower threshold voltage than others, because of uneven wear among the cells within a page, or other reasons. And, of course, some memory cells cannot be programmed or erased whatsoever, because of a defect or other reason. Additionally, some memory cells program fast and can be over programmed, which may also cause an error. As mentioned above, error correction coding provides the capability of tolerating some number of failed cells, while still maintaining the memory as usable. In some applications, a page of data is programmed by repeatedly applying programming pulses until all memory cells on that page verify to the desired programmed state. In some implementation, programming and erasing time is saved by terminating the sequence of programming or erasing pulses when the number of error memory cells that are not yet fully programmed or erased is fewer than the number of bits that are correctable.

FIG. 5A depicts an example of a logical view of memory cell array 200. Although the memory cell array 200 includes many blocks, FIG. 5A shows 6 example blocks 500, 502, 504, 506, 508 and 510. Each block includes a number of word lines. For example, in some embodiments, each blocks includes 128 word lines connecting to memory cells that store data and two dummy word lines (one on each side of the block). FIG. 5A depicts the word lines and the memory cells connected to the word lines as rectangles. For example, block 500 includes word lines/memory cells 500w, block 502 includes word lines/memory cells 502w, block 504 includes word lines/memory cells 504w, block 506 includes word lines/memory cells 506w, block 508 includes word lines/memory cells 508w, and block 510 includes word lines/memory cells 510w. The rectangles 502w and 510w are all blank to indicate that there is no programmed data; therefore, blocks 502 and 510 are completely erased. All of the word lines/memory cells 500w, word lines/memory cells 504w and word lines/memory cells 506w are programmed with data; therefore, blocks 500, 504 and 506 are said to be closed. For block 508, some of the word lines/memory cells 508w are programmed with data and some of the word lines/memory cells 508w are not programmed with data; therefore, block 508 is said to be an open block as it is partially programmed and open to more programming.

In one embodiment, block 500 is used to store system data. For example, the read and verify compare levels discussed below, various offsets, addresses/marks for other blocks reserved for the system, etc. can be stored in block 500.

In one embodiment, blocks 506 and 508 store preloaded data. This is data loaded during the manufacturing process, or at least before making the memory available to the end user. Often, after programming the preloaded data, the memory die 212 is soldered to a printed circuit board or other device using a reflow operation or process (e.g., infrared (IR) reflow soldering) is used to mount the memory die 103 onto another device. For example, a device manufacturer may store the preloaded data into the memory 104 and the data storage device 102 may be assembled later in a process that includes electrically coupling the memory die 212 to the Controller 244, such as by mechanically mounting the memory die 212 onto a printed circuit board (PCB) using an IR reflow operation, where the Controller 244 (e.g., a die including the Controller) is also mechanically mounted onto the same PCB. Sometimes, the heat from the IR reflow process can cause charge to leak from the floating gates. This may cause some errors to the preloaded data, which can be fixed using ECC. However, the IR reflow process for unprogrammed memory cells in open blocks that store preloaded data can cause the unprogrammed memory cells to exhibit poor reliability (ie the data retention). Thus, the technology described below provides a means for testing whether a memory has been subjected to an IR reflow process so that remedial action can be taken if there was an IR reflow process. More details will be discussed later on below.

FIG. 6 is a flow chart describing one embodiment of a process for making and operating a non-volatile storage system. In step 516, the non-volatile storage system is manufactured. This includes testing and (optionally) pre-loading data. In step 518, the non-volatile storage system is initialized, which can include any one or combination of powering on, configuring, waking from sleep mode, first use, or other initialization event. In step 520, a request for programming is received from the Host, the Controller or other entity. In step 522, the Controller (or state machine or other entity) will determine which set of one or more blocks to store the data. In step 524, the data received for the request is programmed into one or more blocks of memory cells. In step 526, the data can be read. The programming and reading can be performed multiple times, in any order.

The dashed line between steps 516 & 518, 518 & 520 and 524 & 526 indicates that there can be an unpredictable amount of time between the steps. Note that the steps of the process of FIG. 6 (as well as the other processes in the other Figures) need not be performed by the same entity, or in the same order as depicted.

FIG. 7 is a flow chart describing a process for programming a block of memory. The process of FIG. 7 is performed one or more times during step 524 of FIG. 6. In one example implementation, memory cells are pre-programmed in order to maintain even wear on the memory cells (step 550). In one embodiment, the memory cells are preprogrammed to the highest data state, a random pattern, or any other pattern. In some implementations, pre-programming need not be performed. Some embodiments do not implement pre-programming.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells in the block will be in state S0 (discussed below). One implementation of an erase process includes applying several erase pulses to the p-well and verifying between erase pulses whether the NAND strings are properly erased.

In step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution. In step 556, the memory cells of the block are programmed. The programming can be performed in response to a request to program from the host, or in response to an internal process. After programming, the memory cells of the block can be read. Many different read processes known in the art can be used to read data. In some embodiments, the read process includes using ECC to correct errors. The data that is read is output to the hosts that requested the read operation. The ECC process can be performed by the state machine, the controller or another device. The erase-program cycle can happen many times without or independent of reading, the read process can occur many times without or independent of programming and the read process can happen any time after programming. The process of FIG. 7 can be performed at the direction of the state machine using the various circuits described above. In other embodiments, the process of FIG. 7 can be performed at the direction of the Controller using the various circuits described above.

At the end of a successful programming process (with verification), the threshold voltages of the memory cells should be within one or more distributions of threshold voltages for programmed memory cells or within a distribution of threshold voltages for erased memory cells, as appropriate.

Figure 8:
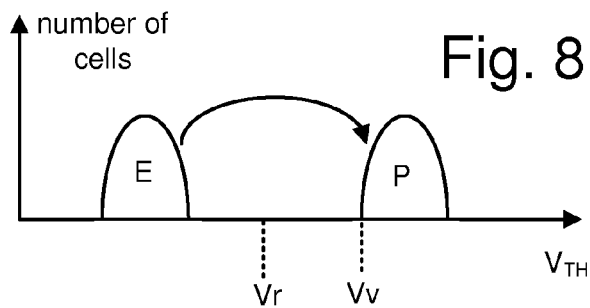
FIG. 8 depicts an example set of threshold voltage distributions and describes a process for programming non-volatile memory.

FIG. 8 illustrates example threshold voltage distributions for the memory cell array when each memory cell stores one bit of data. Other embodiments, however, may use more than one bit of data per memory cell (e.g., such as two, three, or four bits of data per memory cell). FIG. 8 shows two threshold voltage distributions (corresponding to two data states). The first threshold voltage distribution (data state) E represents memory cells that are erased. The second threshold voltage distribution (data state) P represents memory cells that are programmed. The curved arrow indicates the programming process where some memory cells are programmed to go from E to P. In one embodiment, memory cells in data state E store a logical "1" and memory cells in data state P store a logical "0." In one embodiment, the threshold voltages in E are negative and the threshold voltages in P are positive. FIG. 8 also depicts a read reference voltage Vr and verify reference voltage Vv. By testing whether the threshold voltage of a given memory cell is above or below Vr, the system can determine whether the memory cell is erased (E) or programmed (P). When programming memory cells, the system will test whether those memory cells have a threshold voltage greater than or equal to Vv.

Figure 9:
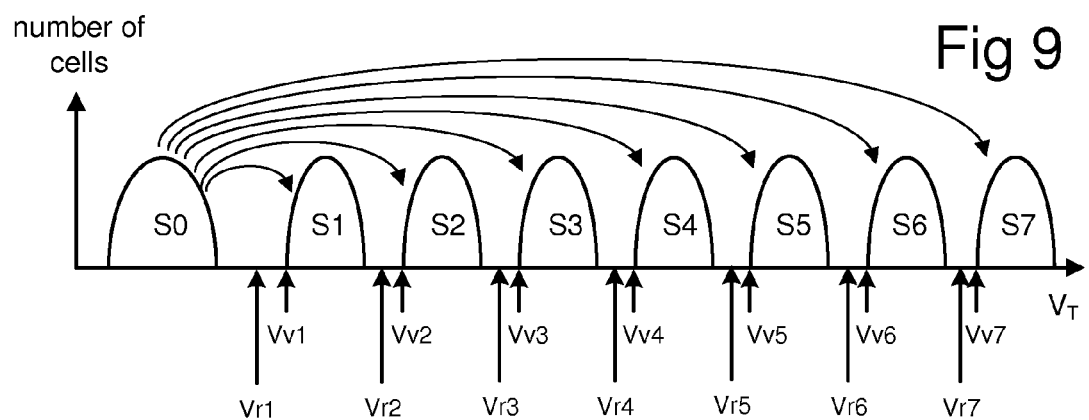
FIG. 9 depicts an example set of threshold voltage distributions and describes a process for programming non-volatile memory.

FIG. 9 illustrates example threshold voltage distributions for the memory cell array when each memory cell stores three bits of data. Other embodiments, however, may use more or less than three bits of data per memory cell (e.g., such as three bits of data per memory cell).

In the example of FIG. 9, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 9.

FIG. 9 shows a set of verify target levels Vv1, Vv2, Vv3, Vv4, Vv5, Vv6, and Vv7. These verify levels are used as comparison levels (also known as target levels and/or compare levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 9 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine for which states that memory cells are storing data.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 9) or verify operation (e.g. see verify target levels Vv1, Vv2, Vv3, Vv4, Vv5, Vv6, and Vv7 of FIG. 9) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 10:
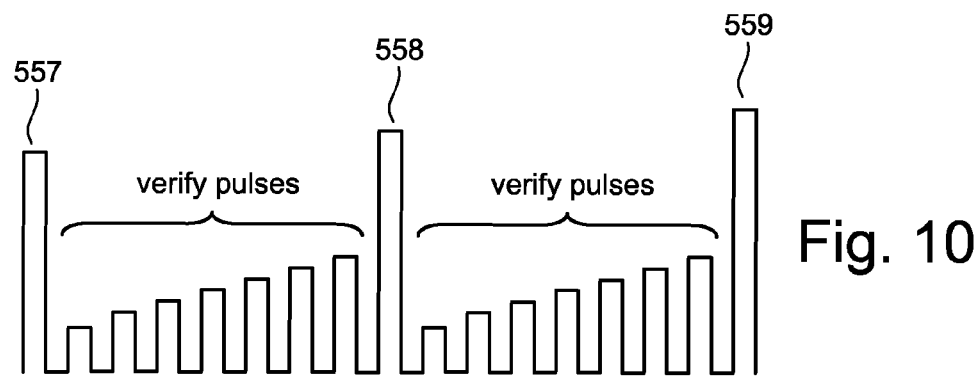
FIG. 10 depicts three programming pulses, and the verify pulses applied between the programming pulses.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 10 shows a portion of a signal applied to the control gates of a plurality of memory cells connected to a common word line. FIG. 10 shows programming pulses 557, 558 and 559, with a set of verify pulses between the programming pulses. When performing full sequence programming in one embodiment, the verification process between programming pulses will test for each of the threshold voltage distribution (data states) S1-S7. Therefore, FIG. 10 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous.

For example, if none of the memory cells being programmed according to FIG. 0 have reached Vv2, there is no reason to verify at Vv7.

FIG. 10 shows a programming process that includes one phase where all memory cells connected to the same word line are programmed concurrently during that one phase. FIGS. 11A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 11A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 11B. Memory cells being programmed to intermediate state IM are programmed to a target threshold voltage of VvIM.

During the second phase of the programming process of FIGS. 11A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 11C.

As can be seen in FIG. 11C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

Figures 11F, 12:
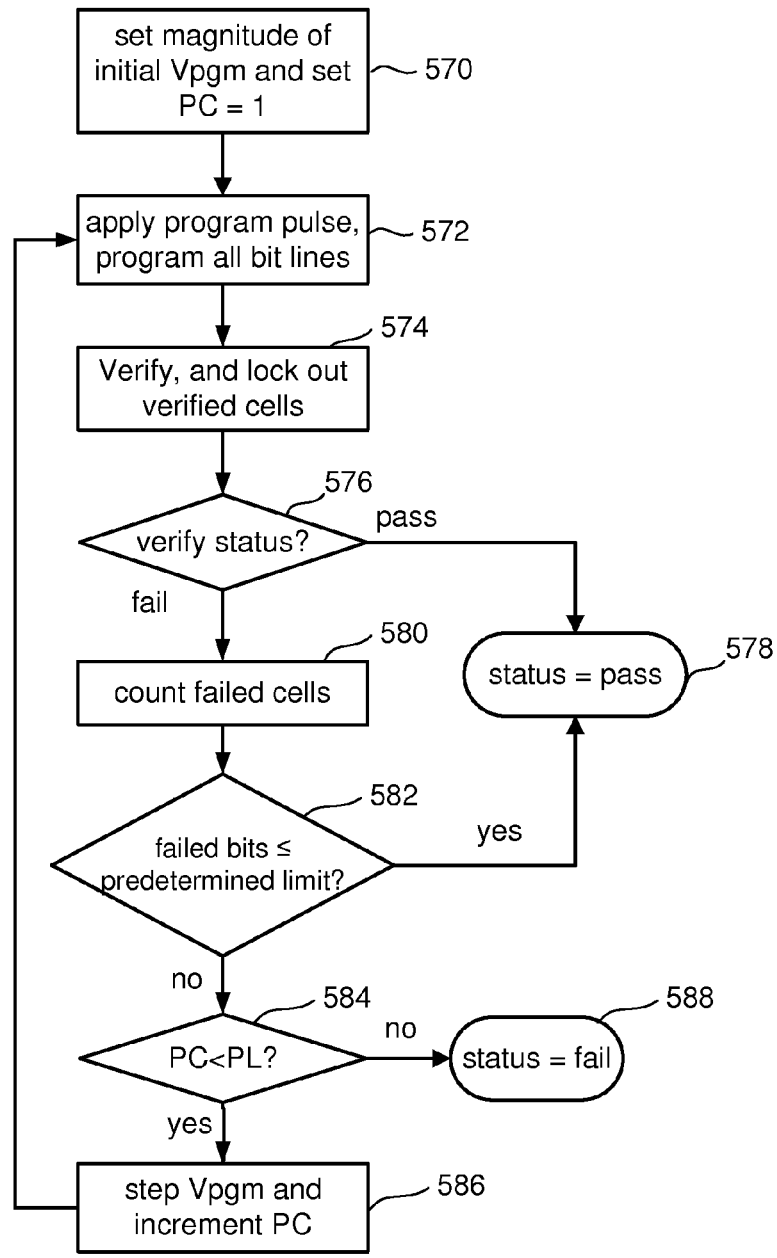
FIG. 11F is a table depicting an example data encoding.
FIG. 12 is a flow chart describing one embodiment of a process for programming non-volatile memory.

In the third phase of programming, each of data states S1-S7 are tightened so that they no longer overlap with neighboring states. This is depicted graphically by FIG. 11D. The final result of the three phrase programming process is depicted in step 11E, which shows data states S0-S7. In some embodiments, data state S0 is wider than data states S1-S7. FIG. 11F shows one example of how data is encoded for the data states of FIGS. 11A-E.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

FIG. 12 is a flow chart describing one embodiment of a process for performing programming on memory cells connected to a common word line to one or more targets (e.g., data states or threshold voltage ranges). The process of FIG. 12 can be performed one or multiple times during step 556 of FIG. 7. For example, the process of FIG. 12 can be used to program memory cells from erased data state E to programmed data state P of FIG. 8; from data state S0 of FIG. 9 to any of data states S1-S7 performing full sequence programming, and any stage of the multi-stage programming process of FIGS. 11A-E.

Typically, the program voltage applied to the control gate during a program operation is applied as a series of program pulses. Between programming pulses are a set of verify pulses to perform verification, as depicted (for example) in FIG. 10. In many implementations, the magnitude of the program pulses is increased with each successive pulse by a predetermined step size. In step 570 of FIG. 12, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target (compare) levels to perform one or more verify operations. In one embodiment, the verification process is performed by applying the testing whether the threshold voltages of the memory cells selected for programming have reached the appropriate verify compare voltage (Vv1, Vv2, Vv3, Vv4, Vv5, Vv6, and Vv7).

In step 576, it is determined whether all the memory cells have reached their target threshold voltages (pass). If so, the programming process is complete and successful because all selected memory cells were programmed and verified to their target states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

Figure 13:
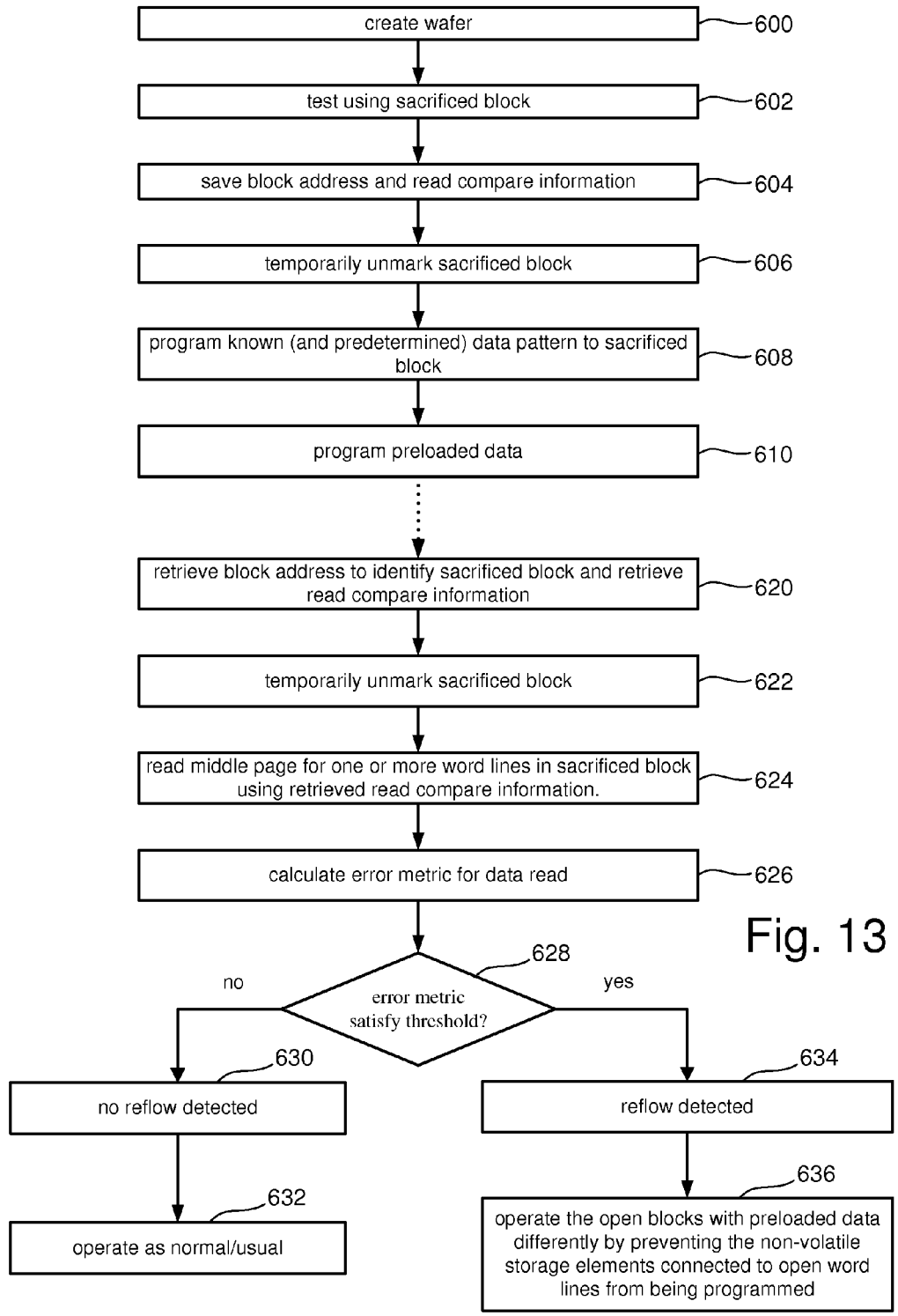
FIG. 13 is a flow chart describing one embodiment of a process for operating non-volatile memory.

FIG. 13 is a flow chart describing one embodiment of a process for operating non-volatile memory that includes determining whether a memory has been subjected to a reflow process (or other event that could cause damage to the memory). In step 600, a wafer is fabricated. In step 602, the wafer is tested. Step 602 can include multiple tests, including testing the wafer as a whole or testing individual dies on the wafer (e.g., such as die sort tests). For some tests, one or more blocks are programmed, erased and/or read. These blocks may undergo many program-erase cycles, which may affect future durability. Therefore, these blocks are said to be sacrificed, meaning that because they are used for the testing they will not be made available to the end user to store data. For example, block 504 of FIG. 51 might be a sacrificed block that was used for testing and will not be available for the end user. The address of the sacrificed blocks will be stored with the system data (e.g., see block 500 of FIG. 5A) in step 604 of FIG. 13. In some embodiments, a mark will also be stored with the address to indicate that the block associated with the address (ie the sacrificed block) is reserved and cannot be used by the end user. During device testing, the system may determine the read compare levels and the verify compare levels (which may include offsets to the read and verify compare levels to compensate for variations in operating environment). Those read compare levels and the verify compare levels will also be stored (separately for each block or for the system as a whole) with the system data in step 604.

In step 606, the sacrificed block used in step 602 (ie block 504 of FIG. 5A) is temporarily unmarked so that the block is no longer reserved and it can now be used by the end user. In step 608, a known (and predetermined) data pattern is programmed to the sacrificed block. In one embodiment, the system programs the data pattern for data state S6 into all of the memory cells, which corresponds to the data 001. So, using the example mentioned above, all of the memory cells in block 504 would be programmed to data state S6. Other data patterns can also be used. The key is that the system knows the data pattern in advance and afterwards so that it is not relying on the user. In step 610, the memory would be programmed to store preloaded data; for example, programming music, software, videos or other data into blocks 506 and 508.

In response to an initialization (e.g. power on) or read request, the system will perform a test to determine if the memory experienced an IR Reflow process after programming the preloaded data. In step 620, the block address of the sacrificed block used in step 602 (ie block 504 of FIG. 5A) is retrieved in order to identify the sacrificed block. The system will also retrieve the read compare points and any associated offsets for reading data from the sacrificed block. In step 622, the sacrificed block used in step 602 (ie block 504 of FIG. 5A) is temporarily unmarked so that the block is no longer reserved and it can now be used by the end user. In step 624, one or more sensing operations are performed for memory cells connected to one or more word lines in the sacrificed block. In one embodiment, the system performs the sensing operations to read memory cells connected to one or more of the middle word lines (e.g. word line WL2 or WL20). A middle word line is a word line not at the end. For example, in a block with 128 word lines (WL0-WL127), then WL0 and WL127 are end word lines and WL1-WL126 are middle word lines. The memory cells being read should be storing the known (and predetermined) data pattern programmed in step 608. The data pattern is known because the system does not need to read the memory cells to know what they are storing. Rather, the system has been programmed in advance to know that the known data pattern (ie. 001) was stored in each memory cells. This way, if a read operation returns anything other than that the known data pattern (ie. 001), then the system knows there is an error.

Data patterns other than 001 can also be used. In one embodiment, the system only reads the middle page; however, in other embodiments other pages or all pages can be read. The reading process is performed with the read compare levels retrieved during step 620.

In step 626, an error metric is calculated. In one embodiment, the system compares the data read from the sacrificed block to the known data pattern and counts the errors. In another embodiment, the system determines the Bit Error Rate from the error correction codes. Other error metrics can also be used. In step 628, the error metric calculated in step 626 is compared to a threshold. If the calculated error metric does not satisfy the threshold, then the process continues at step 630. If the calculated error metric satisfies the threshold, then the process continues at step 634. One example of a threshold is 64 errors per 2 KB of data, so that the error metric would satisfy this threshold if more than 64 errors are found in 2 KB of data. Other thresholds can also be used. Note that if the threshold is set too low, then a normally expected Vt shift could lead to a false detection.

If the error metric does not satisfy the threshold, then the system concludes in step 630 that the memory did not undergo an IR reflow process (no reflow detected). The system will then operate normally (step 632), which means an open block (e.g., block 508) that is storing preloaded data but has some free/empty word lines is allowed to be programmed to store data on the free/empty word lines.

If the error metric does satisfy the threshold, then the system concludes in step 634 that the memory did undergo an IR reflow process (reflow detected). Therefore, the system will operate the open blocks with preloaded data differently than other open blocks (or other blocks with free/unprogrammed word lines). In one example, the system will prevent the non-volatile storage elements connected to unprogrammed word lines in open blocks with preloaded data from being programmed. In another embodiment, the system will move the data from open blocks to new blocks. In another embodiment, the system will scan all of the threshold voltages of the memory cells in the open blocks and create new read compare points.

The dashed line between steps 610 and 620 indicates that there can be an unpredictable amount of time between the steps. Note that the steps of the process of FIG. 13 (as well as the other processes in the other Figures) need not be performed by the same entity, or in the same order as depicted.

In one embodiment, steps 600-610 of FIG. 13 are performed as part of the manufacturing process (see step 516 of FIG. 6).

Steps 620, 622, 624, 626, 628, 630 and 634 of FIG. 13 can be performed as part of the initialization process (see step 518 of FIG. 6), the read process (see step 526 of FIG. 6) or another suitable process. When part of the initialization process, the steps can be performed in response to powering on the device, waking the device from sleep mode, configuring the device or other initialization event.

Steps 632 and 636 are implemented as part of the programming (see step 524 of FIG. 6) or reading (see step 526 of FIG. 6) of the storage device.

In one embodiment, the process of FIG. 13 is performed by the host (see FIG. 3). Software can be stored on one or more processor readable storage devices to program one or more processors to perform the method of FIG. 13.

In another embodiment, the process of FIG. 13 is performed by the Controller 244 (see FIG. 3). Software can be stored on one or more processor readable storage devices to program one or more processors to perform the method of FIG. 13.

In another embodiment, the process of FIG. 13 is performed by the State Machine 2*ee* (see FIG. 3). Software can be stored on one or more processor readable storage devices to program one or more processors to perform the method of FIG. 13.

In another embodiment, the process of FIG. 13 is performed by any combination of the host, controller, state machine or other component.

In some of the embodiments discussed above, the determination of whether an IR reflow process has occurred is used to change treatment of blocks storing preloaded data. However, other embodiments are not limited to pre-loaded data and the change in treatment of the blocks in response to the determination of whether an IR reflow process has occurred can be applied to blocks other than those storing preloaded data.

One embodiment includes a method for operating a non-volatile storage system comprising: identifying a first block storing first data, the first data is already known without having to read from the first block; sensing information for non-volatile storage elements connected to one or more word lines in the identified first block, the non-volatile storage elements connected to one or more word lines store at least a portion of the first data; determining an error metric for the sensed information; determining whether the error metric satisfies a threshold; and identifying that a second block has been subjected to a reflow process if the error metric satisfies the threshold, the second block does not store the first data, the second block stores preloaded data.

One embodiment includes a non-volatile storage system, comprising: a plurality of non-volatile storage elements arranged in blocks including a first block and a second block, the first block is reserved for system use and is not available for storing user data, the first block stores a pre-determined data pattern written to the first block subsequent to system testing and prior to completion of manufacturing of the non-volatile storage system, the second block stores second data; and one or more managing circuits in communication with the plurality of non-volatile storage elements, subsequent to completion of manufacturing of the non-volatile storage system the one or more managing circuits are configured to sense information stored in the first block and determine an error metric for the sensed information with respect to the pre-determined data pattern, one or more managing circuits are configured to operate the second block differently than otherwise, if the error metric satisfies a threshold.

One embodiment includes a method for operating a non-volatile storage system, comprising: identifying a sacrificed block that has been used for system testing, the sacrificed block is storing a known data pattern; sensing information for non-volatile storage elements connected to a word line in the sacrificed block; determining a number of errors for the sensed information; and operating a block storing preloaded data differently than blocks not storing preloaded data if the number of errors satisfies a threshold.

One embodiment includes one or more processor readable storage devices storing processor readable code for programming one or more processors to perform a method comprising: identifying a first block that has been sacrificed for system use, the first block is storing data that is already known without having to read from the first block, the first block is part of a non-volatile storage system; sensing information for a word line in the identified first block, the word line is connected to non-volatile storage element storing at least a portion of the data that is already known; determining a number of errors for the sensed information; determining whether the number of errors is greater than a threshold; and operating a block storing preloaded data differently than blocks not storing preloaded data if the number of errors for the sensed information satisfies a threshold.

One embodiment includes a method for operating a non-volatile storage system comprising: identifying a first block storing first data, the first data is already known without having to read from the first block; sensing information for non-volatile storage elements connected to one or more word lines in the identified first block, the non-volatile storage elements connected to one or more word lines store at least a portion of the first data; determining an error metric for the sensed information; determining whether the error metric satisfies a threshold; and identifying that a second block has been subjected to a reflow process if the error metric satisfies the threshold, the second block does not store the first data, the second block does not store preloaded data.

One embodiments includes a method for operating a non-volatile storage system. The non-volatile storage system includes a memory structure. The memory structure includes plurality of non-volatile storage elements arranged in blocks. The method comprising: identifying a first block storing first data, the first data is already known without having to read from the first block; sensing information for non-volatile storage elements connected to one or more word lines in the identified first block, the non-volatile storage elements connected to one or more word lines store at least a portion of the first data; determining an error metric for the sensed information; determining whether the error metric satisfies a threshold; and determining that the memory structure has experienced an IR reflow process based on whether the error metric satisfies the threshold.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for operating a non-volatile storage system, comprising:
    identifying a first block storing first data, the first data is already known without having to read from the first block;
    sensing information for non-volatile storage elements connected to one or more word lines in the identified first block, the non-volatile storage elements connected to one or more word lines store at least a portion of the first data;
    determining an error metric for the sensed information;
    determining whether the error metric satisfies a threshold; and
    identifying that a second block has been subjected to a reflow process if the error metric satisfies the threshold, the second block does not store the first data, the second block stores preloaded data.

2. The method of claim 1, further comprising:
    operating the second block differently than blocks not storing preloaded data if the number of errors satisfies a threshold in response to identifying that the second block has been subjected to the reflow process.

3. The method of claim 1, wherein:
    the first block is reserved for system use and is not available for storing user data.

4. The method of claim 3, further comprising:
    temporarily unmarking the first block as a reserved block prior to the sensing information.

5. The method of claim 1, wherein:
    the first block is a sacrificed block used for system testing and is not available for storing user data.

6. The method of claim 1, wherein:
    the first data was written to the first block subsequent to system testing and prior to completion of manufacturing of the non-volatile storage system.

7. The method of claim 1, further comprising:
    programming the first data to the first block subsequent to system testing and prior to completion of manufacturing of the non-volatile storage system.

8. The method of claim 7, wherein:
    the non-volatile storage elements connected to the one or more word lines store multiple bits of data per non-volatile storage element in a plurality of data states; and
    the programming the first data to the first block comprises programming the non-volatile storage elements connected to the one or more word lines to a middle data state.

9. The method of claim 7, further comprising:
    temporarily unmarking the first block as a reserved block prior to the programming of the first data to the first block, the first block is reserved for system use and is not available for storing user data; and
    temporarily unmarking the first block as a reserved block prior to the sensing information.

10. The method of claim 1, wherein:
    the sensing includes sensing threshold voltage information from a middle word line.

11. The method of claim 1, wherein:
    the determining the error metric for the sensed information includes determining a bit error rate.

12. The method of claim 1, wherein:
    the determining the error metric for the sensed information includes determining a number of bits that do not match the first data that is already known.

13. The method of claim 1, wherein:
    the second block includes a first set of word lines connected to non-volatile storage elements that are programmed with the preloaded data and a second set of word lines connected to non-volatile storage elements that are not programmed; and
    the method further comprises preventing the non-volatile storage elements connected to the second set of word lines from being programmed in response to identifying that the second block has been subjected to the reflow process.

14. A non-volatile storage system, comprising:
    a plurality of non-volatile storage elements arranged in blocks including a first block and a second block, the first block is reserved for system use and is not available for storing user data, the first block stores a pre-determined data pattern written to the first block subsequent to system testing and prior to completion of manufacturing of the non-volatile storage system, the second block stores second data; and one or more managing circuits in communication with the plurality of non-volatile storage elements, subsequent to completion of manufacturing of the non-volatile storage system the one or more managing circuits are configured to sense information stored in the first block and determine an error metric for the sensed information with respect to the pre-determined data pattern, one or more managing circuits are configured to operate the second block differently than otherwise if the error metric satisfies a threshold.

15. The non-volatile storage system of claim 14, wherein:
the non-volatile storage system comprises a plurality of non-volatile storage elements that store multiple bits of data per non-volatile storage element in a plurality of data states; and
the one or more managing circuits are configured to program the pre-determined data pattern to the first block by programming non-volatile storage elements to a middle data state.

16. The non-volatile storage system of claim 14, wherein:
the second block includes a first set of word lines connected to non-volatile storage elements that are programmed with preloaded data and a second set of word lines connected to non-volatile storage elements that are not programmed; and
the one or more managing circuits are configured to operate the second block differently by preventing the non-volatile storage elements connected to the second set of word lines from being programmed.

17. The non-volatile storage system of claim 14, wherein:
the one or more managing circuits are configured to use the first block for testing during a die sort process; and
the one or more managing circuits are configured to unmark the first block as a reserved block prior to the sensing information stored in the first block.

18. A method for operating a non-volatile storage system, comprising:
identifying a sacrificed block that has been used for system testing, the sacrificed block is storing a known data pattern;
sensing information for non-volatile storage elements connected to a word line in the sacrificed block;
determining a number of errors for the sensed information; and
operating a block storing preloaded data differently than blocks not storing preloaded data if the number of errors satisfies a threshold.

19. The method of claim 18, wherein:
the known data pattern was written to the sacrificed block subsequent to system testing and prior to completion of manufacturing of the non-volatile storage system.

20. The method of claim 18, further comprising:
programming the known data pattern to the sacrificed block subsequent to system testing and prior to completion of manufacturing of the non-volatile storage system.

21. The method of claim 20, wherein:
the non-volatile storage elements connected to the word line store multiple bits of data per non-volatile storage element in a plurality of data states; and
the programming the known data pattern to the sacrificed block comprises programming the non-volatile storage elements connected to the word line to a particular middle data state, the word line is a middle word line.

22. The method of claim 20, further comprising:
temporarily unmarking the sacrificed block as a reserved block prior to the programming the known data pattern to the sacrificed block; and
temporarily unmarking the sacrificed block as a reserved block prior to the sensing information.

23. The method of claim 18, wherein:
the block storing preloaded data includes a first set of word lines connected to non-volatile storage elements that are programmed with the preloaded data and a second set of word lines connected to non-volatile storage elements that are not programmed; and
the operating the block storing preloaded data differently comprises preventing the non-volatile storage elements connected to the second set of word lines from being programmed if the number of errors satisfies a threshold.

24. One or more processor readable storage devices storing processor readable code for programming one or more processors to perform a method comprising:
identifying a first block that has been sacrificed for system use, the first block is storing data that is already known without having to read from the first block, the first block is part of a non-volatile storage system;
sensing information for a word line in the identified first block, the word line is connected to non-volatile storage element storing at least a portion of the data that is already known;
determining a number of errors for the sensed information;
determining whether the number of errors is greater than a threshold; and
operating a block storing preloaded data differently than blocks not storing preloaded data if the number of errors for the sensed information satisfies a threshold.

25. The method of claim 24, wherein:
the known data pattern was written to the sacrificed block subsequent to system testing and prior to completion of manufacturing of the non-volatile storage system.

26. The method of claim 24, wherein:
the non-volatile storage elements connected to the word line each store multiple bits of data per non-volatile storage element in a plurality of data states;
the word line is a middle word line; and
the sensing includes sensing whether the non-volatile storage elements connected to the word line are storing data in a particular middle data state.

27. A method for operating a non-volatile storage system, the non-volatile storage system includes a memory structure, the memory structure includes plurality of non-volatile storage elements arranged in blocks, the method comprising:
identifying a first block storing first data, the first data is already known without having to read from the first block;
sensing information for non-volatile storage elements connected to one or more word lines in the identified first block, the non-volatile storage elements connected to one or more word lines store at least a portion of the first data;
determining an error metric for the sensed information;
determining whether the error metric satisfies a threshold; and
determining that the memory structure has experienced an IR reflow process based on whether the error metric satisfies the threshold.

* * * * *